(12) United States Patent
Roh et al.

(10) Patent No.: US 11,467,623 B2
(45) Date of Patent: Oct. 11, 2022

(54) RECEPTION DEVICE

(71) Applicant: Magnachip Semiconductor, Ltd., Cheongju-si (KR)

(72) Inventors: Gil Sung Roh, Cheongju-si (KR); Sang Kyung Kim, Cheongju-si (KR); Ji Hoon Ha, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 302 days.

(21) Appl. No.: 16/587,917

(22) Filed: Sep. 30, 2019

(65) Prior Publication Data
US 2020/0133329 A1 Apr. 30, 2020

(30) Foreign Application Priority Data
Oct. 26, 2018 (KR) .......................... 10-2018-0128862

(51) Int. Cl.
*G06F 1/12* (2006.01)
*H03L 7/08* (2006.01)
*G06F 1/10* (2006.01)

(52) U.S. Cl.
CPC .................. *G06F 1/12* (2013.01); *G06F 1/10* (2013.01); *H03L 7/0807* (2013.01)

(58) Field of Classification Search
CPC . G06F 1/12; G06F 1/10; H04L 7/0008; H04L 7/0033
See application file for complete search history.

(56) References Cited

U.S. PATENT DOCUMENTS

| | | | | |
|---|---|---|---|---|
| 7,319,730 B2 * | 1/2008 | Okuda | ..................... | H04L 25/14 375/333 |
| 7,669,151 B1 * | 2/2010 | Boyle | ....................... | G06F 1/12 716/115 |

(Continued)

FOREIGN PATENT DOCUMENTS

KR 10-2007-0115715 A 12/2007
KR 10-2008-0086407 A 9/2008
(Continued)

OTHER PUBLICATIONS

Korean Office Action dated Jul. 28, 2022, in counterpart Korean Patent Application No. 10-2018-0128862 (5 pages in Korean).

*Primary Examiner* — Raymond N Phan
(74) *Attorney, Agent, or Firm* — NSIP Law (57) ABSTRACT

A reception device that communicates with a transmission device is provided. The reception device includes a reception circuit configured to receive a clock signal, a first data signal, and a second data signal from the transmission device, a signal synchronization circuit configured to adjust the phases of the first data signal and the second data signal, and generate a first synchronization data signal and a second synchronization data signal, a signal distribution circuit configured to adjust the phase of the clock signal and generate a first distributed clock signal and a second distributed clock signal, and adjust the phases of the first synchronization data signal and the second synchronization data signal and generate a first distributed data signal and a second distributed data signal, and an output circuit configured to process the first distributed data signal and the second distributed data signal.

19 Claims, 8 Drawing Sheets

(56) References Cited

U.S. PATENT DOCUMENTS

| | | | |
|---|---|---|---|
| 9,009,379 B1* | 4/2015 | Marena | G06F 13/4221 |
| | | | 710/308 |
| 10,284,361 B2* | 5/2019 | Chiueh | H04L 7/0079 |
| 10,313,100 B2* | 6/2019 | Yim | G06F 13/4072 |
| 2006/0190756 A1* | 8/2006 | Okamura | H03L 7/07 |
| | | | 713/503 |
| 2012/0294401 A1 | 11/2012 | Lin et al. | |
| 2012/0303996 A1* | 11/2012 | Bauernfeind | H04L 7/0012 |
| | | | 713/503 |
| 2014/0241465 A1* | 8/2014 | Itoigawa | H04L 25/0272 |
| | | | 375/316 |
| 2015/0192949 A1* | 7/2015 | Wu | G11C 7/1093 |
| | | | 713/503 |
| 2016/0301518 A1* | 10/2016 | Ahn | G11C 7/1063 |

FOREIGN PATENT DOCUMENTS

| | | |
|---|---|---|
| KR | 10-2011-0078471 A | 7/2011 |
| KR | 10-2016-0030551 A | 3/2016 |

\* cited by examiner

RECEPTION DEVICE

CROSS-REFERENCE TO RELATED APPLICATION

This application claims the benefit under 35 U.S.C. 119(a) of Korean Patent Application No. 10-2018-0128862, filed on Oct. 26, 2018, the disclosure of which is incorporated herein by reference for all purposes.

BACKGROUND

1. Field

The following description relates to a reception device, operating method, and transmission system with switching noise (or toggling noise) reduction.

2. Description of Related Art

In transmission systems which implement two or more channels (or data lanes), data transmitted from a transmission device to a reception device may be transmitted through a plurality of channels, such that data transmitted by the respective channels may have different phases from each other. That is, data skew may occur between the respective channels. This data skew degrades the accuracy of data transmission and reception (data response characteristic).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a reception device includes a reception circuit configured to receive a clock signal, a first data signal, and a second data signal from the transmission device, a signal synchronization circuit configured to adjust a phase of the first data signal and a phase of the second data signal, and generate a first synchronization data signal and a second synchronization data signal, a signal distribution circuit configured to adjust a phase of the clock signal and generate a first distributed clock signal and a second distributed clock signal, and further configured to adjust a phase of the first synchronization data signal and a phase of the second synchronization data signal, and generate a first distributed data signal and a second distributed data signal, and an output circuit configured to process the first distributed data signal and the second distributed data signal.

The first synchronization data signal and the second synchronization data signal may have a same phase.

A phase of the first distributed data signal and a phase of the second distributed data signal may be different from each other, and a phase difference between the first distributed clock signal and the first distributed data signal is equal to a phase difference between the second distributed clock signal and the second distributed data signal.

The signal distribution circuit may include a first delay circuit configured to adjust the phase of the clock signal and the phase of the first synchronization data signal by a first delay value and generate the first distributed clock signal and the first distributed data signal; and a second delay circuit configured to adjust the phase of the clock signal and the phase of the second synchronization data signal by a second delay value different from the first delay value, and generate the second distributed clock signal and the second distributed data signal.

The output circuit may be configured to process the first distributed data signal in response to the first distributed clock signal, and process the second distributed data signal in response to the second distributed clock signal.

A processing timing of the first distributed data signal and a processing timing of the second distributed data signal may be different from each other.

A transmission line through which the clock signal is transmitted, a transmission line through which the first data signal is transmitted, and a transmission line through which the second data signal is transmitted may be different from each other.

In a general aspect, a method for operating a reception device that communicates with a transmission device and processes signals includes receiving a clock signal, a first data signal, and a second data signal from the transmission device, adjusting a phase of the first data signal and a phase of the second data signal, and generating a first synchronization data signal and a second synchronization data signal, adjusting a phase of the clock signal and generating a first distributed clock signal and a second distributed clock signal, and adjusting a phase of the first synchronization data signal and a phase of the second synchronization data signal, and generating a first distributed data signal and a second distributed data signal, and processing the first distributed data signal and the second distributed data signal.

The phase of the first distributed data signal and the phase of the second distributed data signal may be different from each other, and a phase difference between the first distributed clock signal and the first distributed data signal is equal to a phase difference between the second distributed clock signal and the second distributed data signal.

The phase of the clock signal and the phase of the first synchronization data signal may be adjusted by a first delay value and generating the first distributed clock signal and the first distributed data signal, and the phase of the clock signal and the phase of the second synchronization data signal may be adjusted by a second delay value different from the first delay value and generating the second distributed clock signal and the second distributed data signal.

The processing of the first distributed data signal and the second distributed data signal may include processing the first distributed data signal in response to the first distributed clock signal, and processing the second distributed data signal in response to the second distributed clock signal.

The clock signal may be transmitted through a clock transmission line, and the first data signal and the second data signal may be transmitted through at least one data transmission line.

The transmission device and the reception device may implement a mobile industry processor interface (MIPI).

In a general aspect, a reception device that communicates with a transmission device includes a reception circuit configured to receive a clock signal, a first data signal, and a second data signal from the transmission device, and a signal distribution circuit configured to generate a first distributed clock signal and a second distributed clock signal based on the clock signal, generate a first distributed data signal based on the first data signal, and generate a second distributed data signal based on the second data signal, wherein a phase of the first distributed data signal and a phase of the second distributed data signal are different from each other, and wherein a phase difference between the first distributed clock signal and the first distributed data signal is equal to a phase difference between the second distributed clock signal and the second distributed data signal.

The device may further include an output circuit configured to process the first distributed data signal in response to the first distributed clock signal, and process the second distributed data signal in response to the second distributed clock signal.

A processing timing of the first distributed data signal and a processing timing of the second distributed data signal may be different from each other.

In a general aspect a reception device includes a reception circuit configured to receive a clock signal and data signals, and a signal distribution circuit configured to receive the clock signal and the plurality of data signals, adjust a phase of each of the plurality of data signals, and generate a plurality of distributed data signals based on the adjusted phases, wherein a phase of a first of the plurality of distributed data signals is different from a phase of a second of the plurality of distributed data signals.

The device may be further configured to generate a first distributed clock signal and a second distributed clock signal based on the clock signal.

The device may further include an output circuit configured to process the first distributed data signal in response to the first distributed clock signal, and process the second distributed data signal in response to the second distributed clock signal.

A processing timing of the first distributed data signal and a processing timing of the second distributed data signal may be different from each other.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Figure 1:
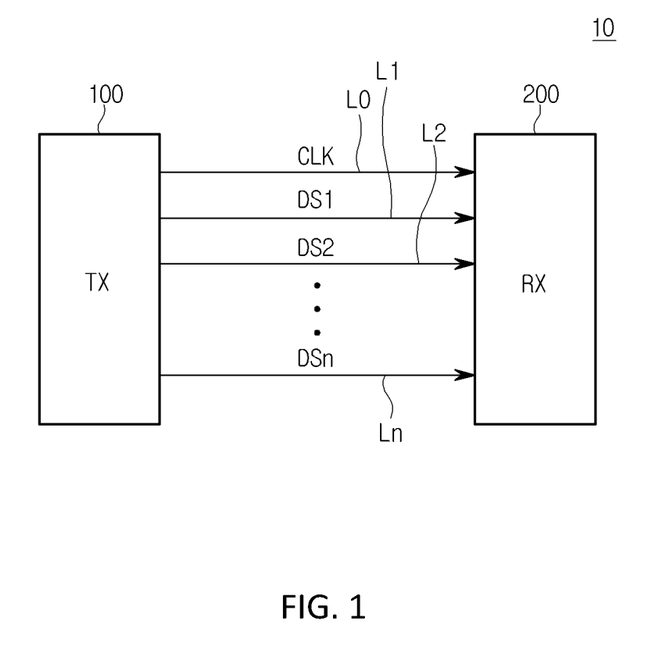
FIG. 1 is a diagram illustrating an example of a transmission system according to one or more embodiments.

FIG. 1 is a diagram illustrating an example of a transmission system.

Referring to FIG. 1, a transmission system 10 may include a transmission device 100, a reception device 200, and a plurality of lanes or transmission lines L0 to Ln (n is an integer of 1 or more) connected between the transmission device 100 and the reception device 200. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The transmission system 10 may mean a system implementing a clock signal CLK and data signals DS1 to DSn. According to the examples, the transmission system 10 may refer to a system including one clock lane (e.g., L0) for transmitting the clock signal CLK, and at least one data lane (e.g., L1) implemented separately from the clock lane L0, and for transmitting at least one data signal DS1 to DSn. For example, the transmission system 10 may include a mobile industry processor interface (MIPI), but is not limited thereto.

Hereinafter, for convenience of explanation, it is assumed and explained that the transmission system 10 includes one clock lane L0 and a plurality of data lanes L1 to Ln.

The transmission device 100 may transmit the clock signal CLK and the data signals DS1 to DSn to the reception device 200. According to the examples, the transmission device 100 may transmit the clock signal CLK through the clock lane L0, and may transmit the data signals DS1 to DSn through the data lanes L1 to Ln.

According to the examples, the transmission device 100, as a host device, may be implemented by one or more processors such as an application processor (AP) or a central processing unit (CPU), but is not limited thereto.

The reception device 200 may receive the clock signal CLK and the data signals DS1 to DSn from the transmission device 100. According to the examples, the reception device 200 may receive the clock signal CLK through the clock lane L0, and may receive the data signals DS1 to DSn through the data lanes L1 to Ln.

According to the examples, the reception device 200 may be a slave device that operates according to a control of the transmission device 100. As a non-limiting example, the reception device 200 may be a memory device, a camera, a sensor, a communication circuit or a codec or a peripheral device, but is not limited thereto.

Figure 2:
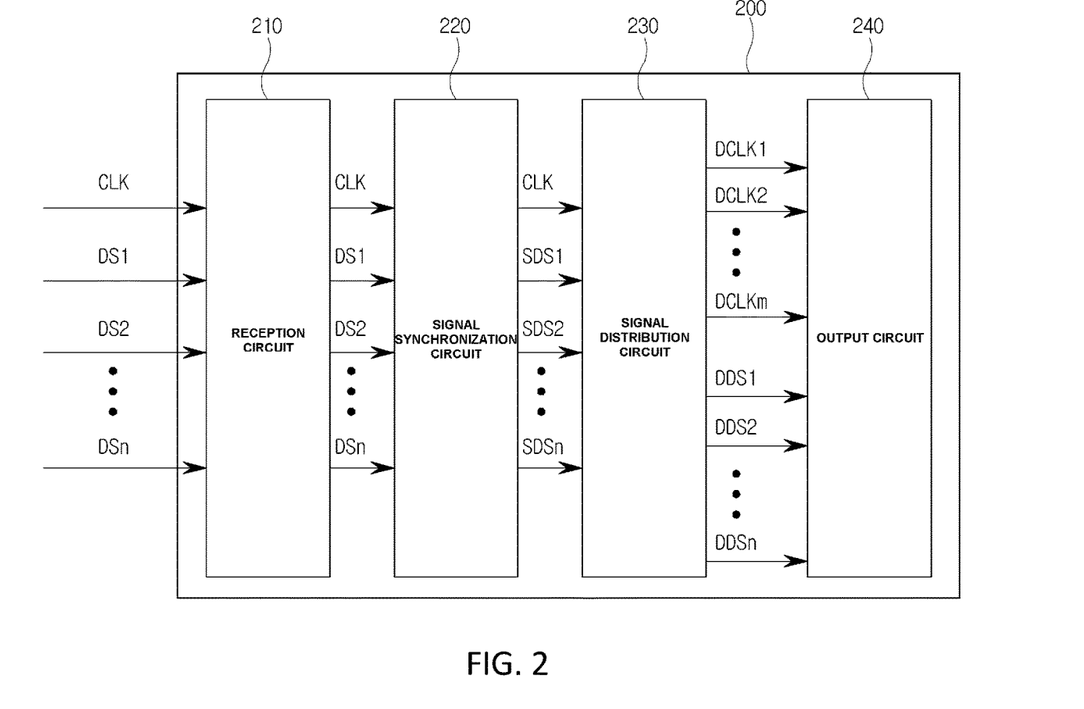
FIG. 2 is a diagram illustrating an example of a reception device according to one or more embodiments.

FIG. 2 is a diagram illustrating an example of a reception device.

Referring to FIGS. 1 and 2, the reception device 200 may include a reception circuit 210, a signal synchronization circuit 220, a signal distribution circuit 230, and an output circuit 240.

The reception circuit 210 may receive the clock signal CLK through the clock lane L0, and may receive the data signals DS1 to DSn through the data lanes L1 to Ln. The reception circuit 210 may transmit the received signals CLK and DS1 to DSn to the signal synchronization circuit 220.

The signal synchronization circuit 220 may receive the clock signal CLK and the data signals DS1 to DSn, and may eliminate the data skew of the data signals DS1 to DSn.

The signal synchronization circuit 220 may generate the synchronization data signals SDS1 to SDSn based on the received clock signal CLK and the received data signals DS1 to DSn. According to the examples, the signal synchronization circuit 220 may generate the phase-adjusted synchronization data signals SDS1 to SDSn by adjusting the phases of the data signals DS1 to DSn. For example, the signal synchronization circuit 220 may generate the first synchronization data signal SDS1 by adjusting the phase of the first data signal DS1, and may generate the second synchronization data signal SDS2 by adjusting the phase of the second data signal DS2.

In the examples, adjusting the phase of the signal (or data) may mean adjusting the timing of the signal by delaying the signal. For example, the phase of the signal may be adjusted by adjusting the (generating) timing of the edge (rising edge or falling edge) of the signal.

The synchronization data signals SDS1 to SDSn may have the same phase. That is, all of the phase margins (or phase differences) between each of the synchronization data signals SDS1 to SDSn, and the clock signal CLK may be the same. For example, the phase margin between each of the synchronization data signals SDS1 to SDSn and the clock signal CLK may be a reference phase margin M_REP. The reference phase margin M_REP is a predetermined value.

According to the examples, the reference phase margin M_REP may indicate a phase margin needed (or enough) to process (or receive) the data signals with the clock signal in the reception device 200.

According to the examples, the signal synchronization circuit 220 may adjust (or delay) the phase of the data signals DS1 to DSn based on the clock signal CLK, and may generate synchronization data signals SDS1 to SDSn. For example, the signal synchronization circuit 220 may adjust the phases of the data signals DS1 to DSn so that the distance between the edge (rising edge or falling edge) of the data signals DS1 to DSn and the edge of the clock signal CLK becomes a reference value.

The signal synchronization circuit 220 may transmit the clock signal CLK and the synchronization data signals SDS1 to SDSn.

The signal distribution circuit 230 may receive the clock signal CLK and the synchronization data signals SDS1 to SDSn. The signal distribution circuit 230 may generate distributed clock signals DCLK1 to DCLKm (m is a natural number of 1 or more) by adjusting the phase of the clock signal CLK, and may generate distributed data signals DDS1 to DDSn by adjusting the phases of the synchronization data signals SDS1 to SDSn. For example, the signal distribution circuit 230 may generate the first distributed data signal DDS1 by adjusting the phase of the first synchronization data signal SDS1, and may generate the second distributed data signal DDS2 by adjusting the phase of the second synchronization data signal SDS2.

According to the examples, the number (e.g., m) of a plurality of distributed clock signals DCLK1 to DCLKm may be equal to or smaller than the number (e.g., n) of the plurality of distributed data signals DDS1 to DDSn. For example, the number (e.g., m) of the plurality of distributed clock signals DCLK1 to DCLKm may be equal to the number of the data lanes L1 to Ln.

The phase of each of the plurality of distributed clock signals DCLK1 to DCLKm may be different from each other, but is not limited thereto, and the phases of at least two distributed clock signals among the plurality of distributed clock signals DCLK1 to DCLKm may also be different from each other. As described above, when the phases of at least two distributed clock signals among the plurality of distributed clock signals DCLK1 to DCLKm are different from each other, the switching timing (due to the distributed clock signals) may be distributed, thereby reducing switching noise. When a plurality of data signals are processed at the same time via one clock signal, the switching noise occurs. However, according to the examples, the distributed data signals are processed at different time via the plurality of distributed clock signal, thereby the switching noise is reduced.

The signal distribution circuit 230 may output the plurality of distributed clock signals DCLK1 to DCLKm and the plurality of distributed data signals DDS1 to DDSn.

The output circuit 240 may receive the plurality of distributed clock signals DCLK1 to DCLKm and the plurality of distributed data signals DDS1 to DDSn, and may process and output the plurality of distributed data signals DDS1 to DDSn.

According to the examples, the output circuit 240 may convert in parallel and output each of the plurality of distributed data signals DDS1 to DDSn input in series. For example, the output circuit 240 may be a serial-parallel converter or deserializer.

According to the examples, the output circuit 240 may process or output the plurality of distributed data signals DDS1 to DDSn in response to the distributed clock signals DCLK1 to DCLKm. For example, the output circuit 240 may process (or output) the first distributed data signal DDS1 in response to the first distributed clock signal DCLK1, and may process (or output) the second distributed data signal DDS2 in response to the second distributed clock signal DCLK2.

According to the examples, the output circuit 240 may process or output the plurality of distributed data signals DDS1 to DDSn in response to the edges (rising edges or falling edges) of the distributed clock signals DCLK1 to DCLKm.

As described above, when the phases of at least two distributed clock signals (e.g., the distributed clock signals DCLK1 and DCLK2) among the distributed clock signals DCLK1 to DCLKm are different from each other, the timing at which the distributed data signals (e.g., the distributed data signals DDS1 and DDS2) corresponding to each of the at least two distributed clock signals are output (or processed) by the output circuit 240 is changed, and as a result, the switching timing (by the distributed clock signals) may be distributed, thereby reducing switching noise. When a plurality of data signals are processed at the same time via one clock signal, the switching noise occurs. However, according to the examples, the distributed data signals are processed at different time via the plurality of distributed clock signal, thereby the switching noise is reduced.

Figure 3:
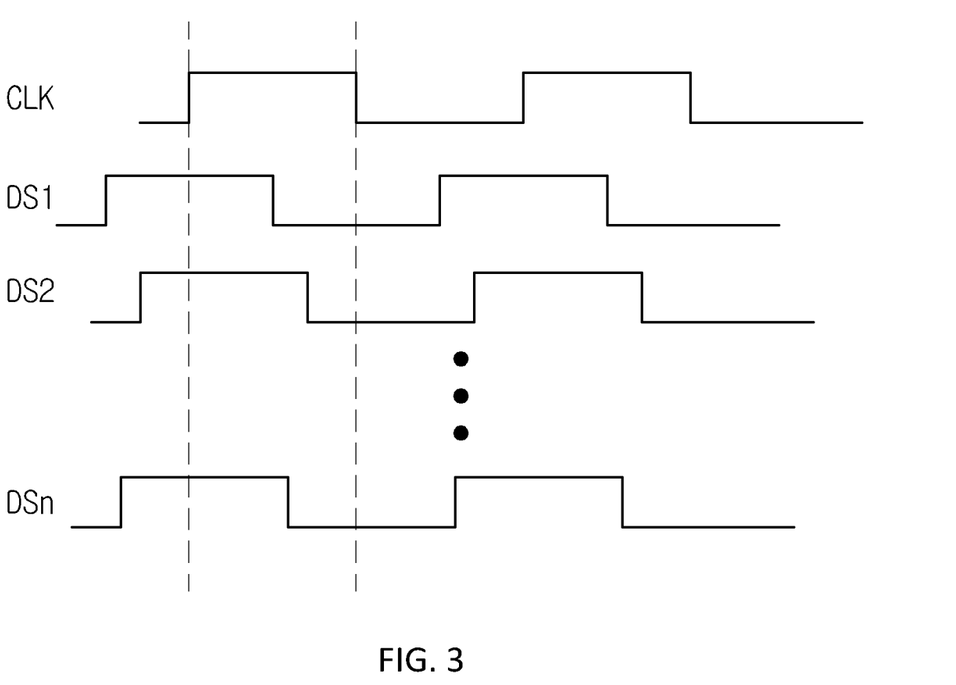
FIGS. 3 and 4 are examples of timing diagrams illustrating the timings of signals according to one or more embodiments.
Figure 4:
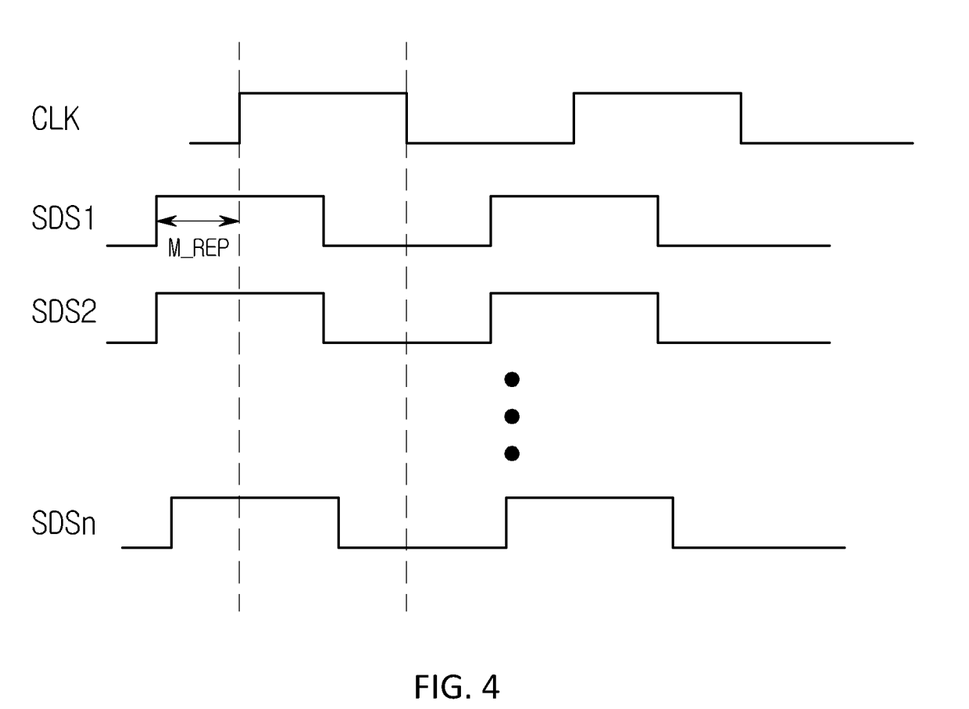

FIGS. 3 and 4 are timing diagrams illustrating the timings of signals according to an example.

Referring to FIG. 3, the data signals DS1 to DSn may be received by the reception circuit 210. According to an example, each interval (a low interval or a high interval) of data signals DS1 to DSn may indicate bit data. For example, one low interval of data signals DS1 to DSn may indicate bit data of "0" and one high interval of data signals DS1 to DSn may indicate bit data of "1", but is not limited thereto.

The data signals DS1 to DSn may be received by the reception circuit 210, and may have different phases from each other. In this example, data skew may occur in the transmission system 10. However, as illustrated in FIG. 4, when the phases of the synchronization data signals SDS1 to SDSn generated by the signal synchronization circuit 220 are equal to each other, data skew may not occur, and as a result, the data transmission/reception characteristics (or response characteristics) may be improved.

Figure 5:
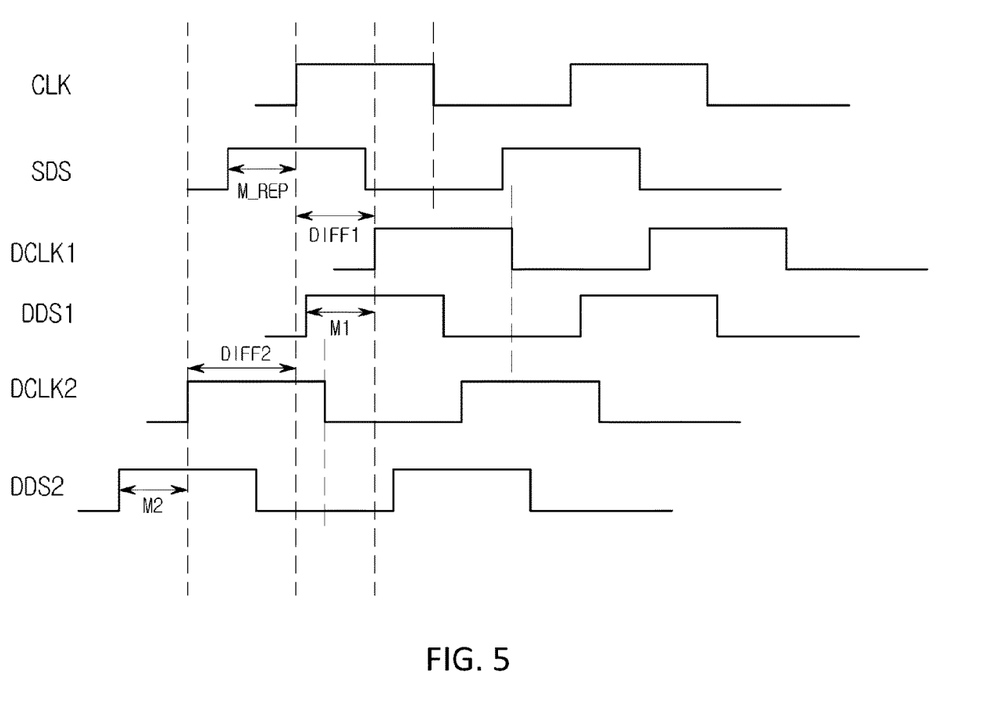
FIGS. 5 and 6 are examples of timing diagrams illustrating an operation of a signal distribution circuit according to one or more embodiments.
Figure 6:
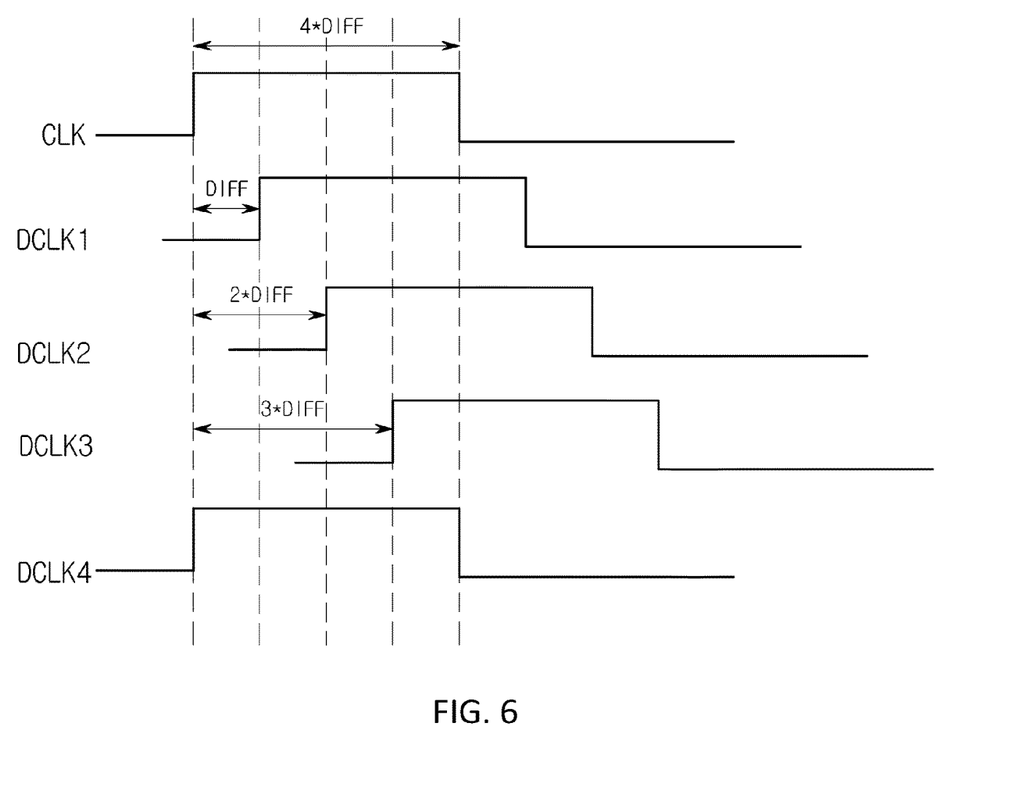

FIGS. 5 and 6 are timing diagrams illustrating an example of an operation of the signal distribution circuit.

Referring to FIGS. 1 to 6, the signal distribution circuit 230 may generate a distributed clock signal and at least one distributed data signal by adjusting the phase of the clock signal CLK and the phase of at least one synchronization data signal among the synchronization data signals SDS1 to SDSn by the same delay value. In this example, since the phase margin between the at least one distributed data signal and the distributed clock signal is maintained at the reference phase margin M_REP (as illustrated in FIG. 4), data skew does not occur and the data response characteristic may be maintained.

According to the examples, the signal distribution circuit 230 may generate the first distributed clock signal DCLK1 and the first distributed data signal DDS1 by adjusting the phase of the clock signal CLK and the phase of the first synchronization data signal SDS1 among the synchronization data signals SDS1 to SDSn by a first delay value DIFF1, and may generate the second distributed clock signal DCLK2 and the second distributed data signal DDS2 by adjusting the phase of the clock signal CLK and the phase of the second synchronization data signal SDS2 among the synchronization data signals SDS1 to SDSn by a second delay value DIFF2 different from the first delay value DIFF1.

As illustrated in FIG. 5, since the first delay value DIFF1 and the second delay value DIFF2 are different from each other, the phases of the first distributed clock signal DCLK1 and the second distributed clock signal DCLK2 become different from each other. However, a phase margin M1 of the first distributed clock signal DCLK1 and the first distributed data signal DDS1 and a phase margin M2 of the second distributed clock signal DCLK2 and the second distributed data signal DDS2 become the same.

As described above, when the phases of the synchronization data signals SDS1 to SDSn generated by the signal synchronization circuit 220 are equal to each other (e.g., FIG. 4), data skew may not occur, thereby improving the data response characteristic, but the timings of all of the synchronization data signals SDS1 to SDSn become the same by the single clock signal CLK, such that switching noise (or toggling noise) may occur. However, the signal distribution circuit 230 may not only generate the first distributed clock signal DCLK1 and the second distributed clock signal DCLK2 which are different in phase from each other, thereby reducing the switching noise, but may also make the phase margin M1 of the first distributed clock signal DCLK1 and the first distributed data signal DDS1 and the phase margin M2 of the second distributed clock signal DCLK2 and the second distributed data signal DDS2 equal to each other, thereby improving the data response characteristic as well.

Meanwhile, as described above, although the signal synchronization circuit 220 and the signal distribution circuit 230 have been described separately, the signal synchronization circuit 220 and the signal distribution circuit 230 may be implemented by a single circuit according to an example. For example, the signal distribution circuit 230 may receive the data signals DS1 to DSn rather than the synchronization data signals SDS1 to SDSn, and may generate the distributed data signals DDS1 to DDSn by adjusting the phases of the data signals DS1 to DSn. As described above, when the phase margin (or phase difference) between each of the synchronization data signals SDS1 to SDSn and the clock signal CLK is the same, the distributed data signals DDS1 to DDSn may be generated by adjusting the phases of the respective data signals DS1 to DSn in order to have the phase margin with respect to the distributed clock signals DCLK1 to DCLKm without the synchronization process of the data signals DS1 to DSn. For example, the first distributed data signal DDS1 may be generated by adjusting the phase of the first data signal DS1 in order to have the phase margin from the first distributed clock signal DCLK1.

According to the examples, the signal distribution circuit 230 may adjust the phases of the clock signal CLK and the plurality of synchronization data signals SDS1 to SDSn based on the reference delay value. As illustrated in FIG. 6, the signal distribution circuit 230 may generate the distributed clock signals DCLK1 to DCLK4 by adjusting the phase of the clock signal CLK based on an integer multiple of the reference delay value DIFF.

For example, the signal distribution circuit 230 may generate the first distributed clock signal DCLK1 by delaying the phase of the clock signal CLK by the reference delay value DIFF, generate the second distributed clock signal DCLK2 by delaying the phase of the clock signal CLK by 2* the reference delay value DIFF, generate the third distributed clock signal DCLK3 by delaying the phase of the clock signal CLK by 3* the reference delay value DIFF, and generate the fourth distributed clock signal DCLK4 by not delaying the phase of the clock signal CLK (i.e., 0* the reference delay value DIFF). At this time, the reference delay value DIFF may be based on the pulse width of the clock signal CLK. For example, the reference delay value DIFF may be a value obtained by dividing the pulse width (i.e., 4*DIFF) of the clock signal CLK by the number of data lanes (in this case, 4), but is not limited thereto.

FIG. 6 illustrates the generating of the distributed clock signals DCLK1 to DCLK4 based on the reference delay value DIFF. Similarly, the distributed data signals DDS1 to DDS4 may be generated based on the reference delay value DIFF.

Figure 7:
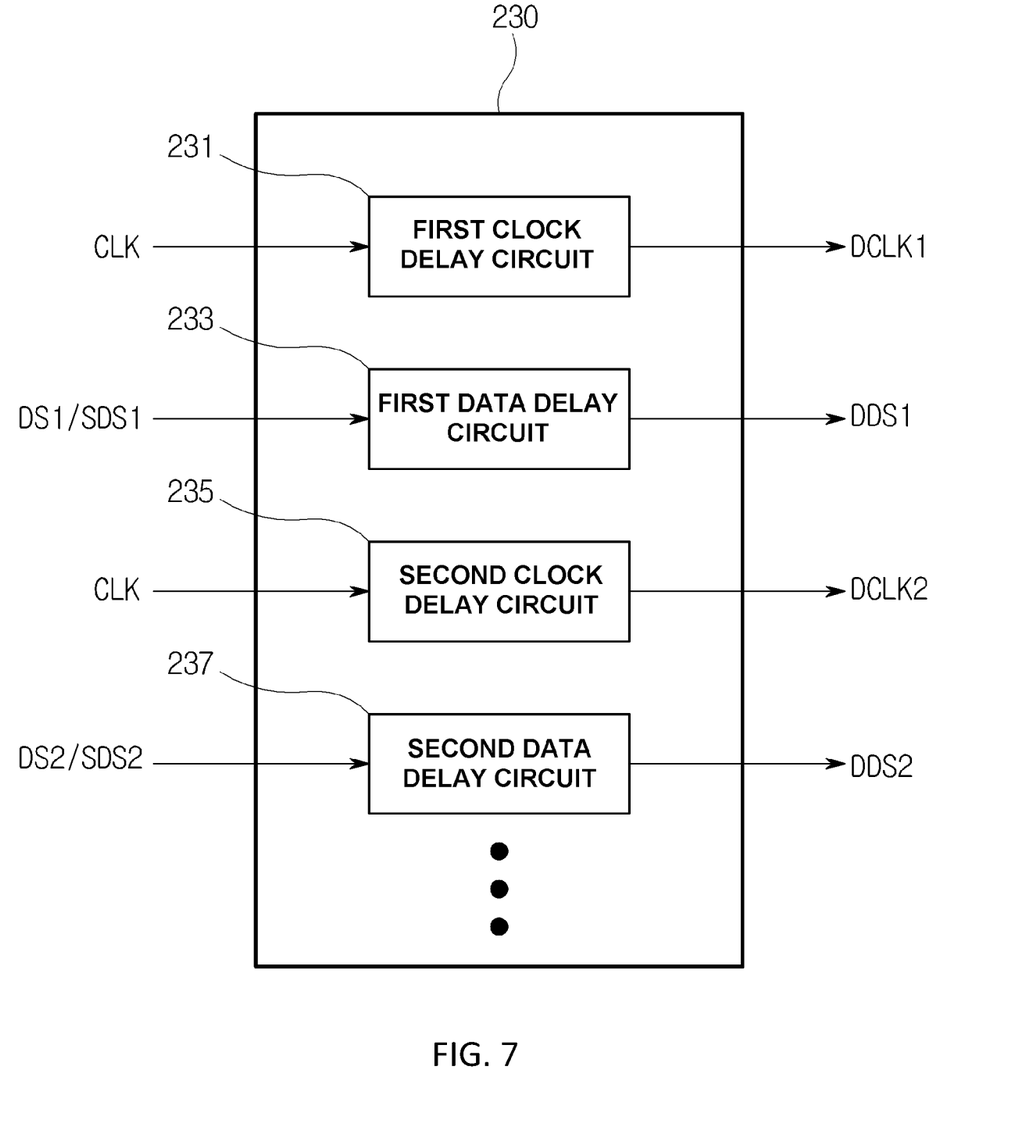
FIG. 7 is a diagram illustrating an example of a signal distribution circuit according to one or more embodiments.

FIG. 7 is a diagram illustrating an example of the signal distribution circuit.

Referring to FIGS. 1 to 7, the signal distribution circuit 230 may include clock delay circuits (e.g., 231 and 235) and data delay circuits 233 and 237. Although only two clock delay circuits and two data delay circuits are illustrated in FIG. 7, the examples are not limited thereto.

The first clock delay circuit 231 may receive the clock signal CLK, and may generate the first distributed clock signal DCLK1 by adjusting the phase of the clock signal CLK. Similarly, the second clock delay circuit 235 may receive the clock signal CLK, and may generate the second distributed clock signal DCLK2 by adjusting the phase of the clock signal CLK.

The first data delay circuit 233 may receive the first synchronization data signal SDS1 (or the first data signal DS1), and may generate the first distributed data signal DDS1 by adjusting the phase of the first synchronization data signal SDS1 (or the first data signal DS1). Similarly, the second data delay circuit 237 may receive the second synchronization data signal SDS2 (or the second data signal DS2), and may generate the second distributed data signal DDS2 by adjusting the phase of the second synchronization data signal SDS2 (or the second data signal DS2).

According to the examples, the delay values of the clock delay circuit (e.g., the first clock delay circuit 231) and the corresponding data delay circuit (e.g., the first data delay circuit 233) may be the same, but is not limited thereto. For example, the clock delay circuit 231 or 235 and the data delay circuit 233 or 237 may be implemented by a single circuit.

Figure 8:
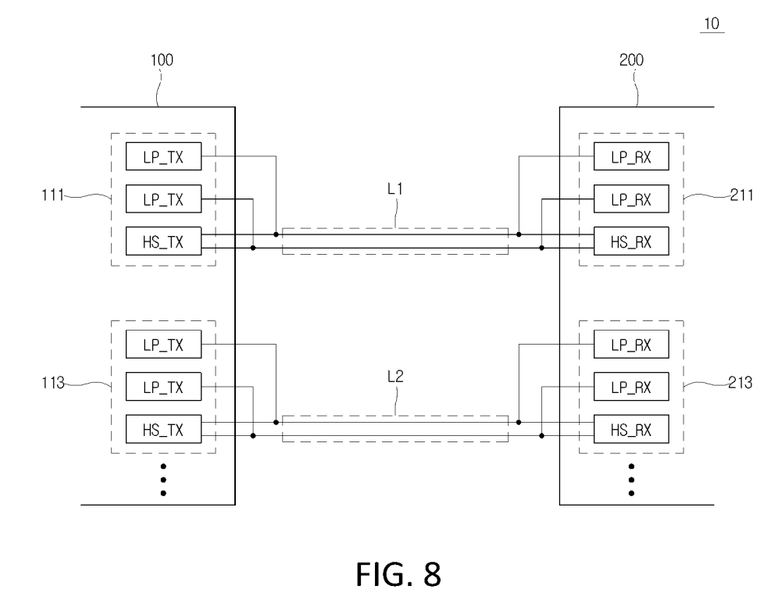
FIG. 8 is a diagram illustrating an example of a transmission system according to one or more embodiments.

FIG. 8 is a diagram illustrating an example of a transmission system.

Referring to FIGS. 1 to 8, the transmission device 100 may include a plurality of transmission circuits (e.g., a first transmission circuit 111 and a second transmission circuit 113), and the reception device 200 may include a plurality of reception circuits (e.g., a first reception circuit 211 and a second reception circuit 213). According to the examples, the transmission system 10 may adopt the mobile industry processor interface (MIR).

Each of the transmission circuits 111 and 113 may include one high-speed transmitter HS_TX and two low-power transmitters LP_TX. The high-speed transmitter HS_TX may transmit (or process) a high-speed differential signal, and the low-power transmitter LP_TX may transmit a low-power single-ended signal. Although only a single high-speed transmitter HS_TX and two low-power transmitters LP_TX are illustrated, this is only an example, and the transmission circuits 111, 113 may include a plurality of high-speed transmitter HS_TX, and one or a plurality of low-power transmitters LP_TX.

Similarly, each of the reception circuits 211 and 213 may include one high-speed receiver HS_RX and two low-power receivers LP_RX. The high-speed receiver HS_RX may receive (or process) the high-speed differential signal, and the low-power receiver LP_RX may receive the low-power single-ended signal. Although only a single high-speed receiver HS_RX and two low-power receivers LP_RX are illustrated, this is only an example, and the reception circuits 211, 213 may include a plurality of high-speed receivers HS_RX, and one or a plurality of low-power receivers LP_RX.

According to the examples, each of the lanes or transmission lines L1 and L2 may include two transmission lines, but is not limited thereto.

A structure of the high-speed receiver and the low-power receiver of the reception device 200 illustrated in FIG. 8 may be applied to the reception device 200 described with reference to FIGS. 1 to 7.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A reception device that communicates with a transmission device, the reception device comprising:
   a reception circuit configured to receive a clock signal, a first data signal, and a second data signal from the transmission device;
   a signal synchronization circuit configured to adjust a phase of the first data signal and a phase of the second data signal, and generate a first synchronization data signal and a second synchronization data signal;
   a signal distribution circuit configured to adjust a phase of the clock signal and generate a first distributed clock signal and a second distributed clock signal, and further configured to adjust a phase of the first synchronization data signal and a phase of the second synchronization data signal, and generate a first distributed data signal and a second distributed data signal; and
   an output circuit configured to process the first distributed data signal and the second distributed data signal.

2. The device of claim 1, wherein the first synchronization data signal and the second synchronization data signal have a same phase.

3. The device of claim 1, wherein a phase of the first distributed data signal and a phase of the second distributed data signal are different from each other, and
   wherein a phase difference between the first distributed clock signal and the first distributed data signal is equal to a phase difference between the second distributed clock signal and the second distributed data signal.

4. The device of claim 1, wherein the output circuit is configured to process the first distributed data signal in response to the first distributed clock signal, and process the second distributed data signal in response to the second distributed clock signal.

5. The device of claim 1, wherein a transmission line through which the clock signal is transmitted, a transmission line through which the first data signal is transmitted, and a transmission line through which the second data signal is transmitted are different from each other.

6. The device of claim 3, wherein the signal distribution circuit comprises:
a first delay circuit configured to adjust the phase of the clock signal and the phase of the first synchronization data signal by a first delay value and generate the first distributed clock signal and the first distributed data signal; and
a second delay circuit configured to adjust the phase of the clock signal and the phase of the second synchronization data signal by a second delay value different from the first delay value, and generate the second distributed clock signal and the second distributed data signal.

7. The device of claim 4, wherein a processing timing of the first distributed data signal and a processing timing of the second distributed data signal are different from each other.

8. A method for operating a reception device that communicates with a transmission device and processes signals, the method comprising:
receiving a clock signal, a first data signal, and a second data signal from the transmission device;
adjusting a phase of the first data signal and a phase of the second data signal, and generating a first synchronization data signal and a second synchronization data signal;
adjusting a phase of the clock signal and generating a first distributed clock signal and a second distributed clock signal, and adjusting a phase of the first synchronization data signal and a phase of the second synchronization data signal, and generating a first distributed data signal and a second distributed data signal; and
processing the first distributed data signal and the second distributed data signal.

9. The method of claim 8, wherein the phase of the first distributed data signal and the phase of the second distributed data signal are different from each other, and
wherein a phase difference between the first distributed clock signal and the first distributed data signal is equal to a phase difference between the second distributed clock signal and the second distributed data signal.

10. The method of claim 8, wherein the processing of the first distributed data signal and the second distributed data signal comprises:
processing the first distributed data signal in response to the first distributed clock signal, and processing the second distributed data signal in response to the second distributed clock signal.

11. The method of claim 8, wherein the clock signal is transmitted through a clock transmission line, and
wherein the first data signal and the second data signal are transmitted through at least one data transmission line.

12. The method of claim 8, wherein the transmission device and the reception device implement a mobile industry processor interface (MIPI).

13. The method of claim 9, further comprising
adjusting the phase of the clock signal and the phase of the first synchronization data signal by a first delay value and generating the first distributed clock signal and the first distributed data signal; and
adjusting the phase of the clock signal and the phase of the second synchronization data signal by a second delay value different from the first delay value and generating the second distributed clock signal and the second distributed data signal.

14. A reception device that communicates with a transmission device, the reception device comprising:
a reception circuit configured to receive a clock signal, a first data signal, and a second data signal from the transmission device; and
a signal distribution circuit configured to generate a first distributed clock signal and a second distributed clock signal based on the clock signal, generate a first distributed data signal based on the first data signal, and generate a second distributed data signal based on the second data signal,
wherein a phase of the first distributed data signal and a phase of the second distributed data signal are different from each other, and
wherein a phase difference between the first distributed clock signal and the first distributed data signal is equal to a phase difference between the second distributed clock signal and the second distributed data signal.

15. The device of claim 14, further comprising
an output circuit configured to process the first distributed data signal in response to the first distributed clock signal, and process the second distributed data signal in response to the second distributed clock signal.

16. The device of claim 15, wherein a processing timing of the first distributed data signal and a processing timing of the second distributed data signal are different from each other.

17. A reception device comprising:
a reception circuit configured to receive a clock signal and a plurality of data signals; and
a signal distribution circuit configured to receive the clock signal and the plurality of data signals, adjust a phase of each of the plurality of data signals, and generate a plurality of distributed data signals based on the adjusted phases,
wherein the signal distribution circuit is further configured to generate a first distributed clock signal and a second distributed clock signal based on the clock signal, and
wherein a phase of a first of the plurality of distributed data signals is different from a phase of a second of the plurality of distributed data signals.

18. The device of claim 17, further comprising an output circuit configured to process the first distributed data signal in response to the first distributed clock signal, and process the second distributed data signal in response to the second distributed clock signal.

19. The device of claim 17, wherein a processing timing of the first distributed data signal and a processing timing of the second distributed data signal are different from each other.

* * * * *